United States Patent
Fukuda et al.

(10) Patent No.: US 8,227,981 B2
(45) Date of Patent: Jul. 24, 2012

(54) LIGHT-EMITTING DEVICE, ILLUMINATION APPARATUS, AND DISPLAY APPARATUS

(75) Inventors: Toshihiro Fukuda, Kanagawa (JP); Jiro Yamada, Kanagawa (JP); Yohei Ebihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 24 days.

(21) Appl. No.: 13/009,197

(22) Filed: Jan. 19, 2011

(65) Prior Publication Data

US 2011/0187259 A1    Aug. 4, 2011

(30) Foreign Application Priority Data

Jan. 29, 2010   (JP) ................... 2010-018490

(51) Int. Cl.
*H01J 1/62* (2006.01)
(52) U.S. Cl. ......... 313/506; 313/504; 313/113; 313/114
(58) Field of Classification Search ............ 313/113, 313/114, 504, 506
See application file for complete search history.

(56) References Cited

U.S. PATENT DOCUMENTS

| | | | |
|---|---|---|---|
| 7,102,282 | B1 | 9/2006 | Yamada et al. |
| 7,273,663 | B2 | 9/2007 | Liao et al. |
| 7,560,862 | B2 | 7/2009 | Liao et al. |

FOREIGN PATENT DOCUMENTS

| | | |
|---|---|---|
| JP | 2000-243573 | 9/2000 |
| JP | 2002-289358 | 10/2002 |
| JP | 2004-079421 | 3/2004 |
| JP | 2006-173550 | 6/2006 |
| JP | 2006-244712 | 9/2006 |
| JP | 2006-244713 | 9/2006 |
| JP | 2008-511100 | 4/2008 |
| JP | 2008-518400 | 5/2008 |
| JP | 3508741 | 1/2011 |
| WO | 01/39554 | 5/2001 |

*Primary Examiner* — Vip Patel
(74) *Attorney, Agent, or Firm* — SNR Denton US LLP

(57) ABSTRACT

A light-emitting device including: an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode; a first reflective interface which is provided on the side of the first electrode so as to reflect light emitted from the first light-emitting layer and the second light-emitting layer to be emitted from the side of the second electrode; and a second reflective interface and a third reflective interface which are sequentially provided on the side of the second electrode at mutually separated positions in that order in a direction from the first electrode to the second electrode.

17 Claims, 16 Drawing Sheets

LIGHT-EMITTING DEVICE, ILLUMINATION APPARATUS, AND DISPLAY APPARATUS

BACKGROUND OF THE INVENTION

1. Field of the Invention

This invention relates to a light-emitting device, an illumination apparatus, and a display apparatus. More specifically, the invention relates to a light-emitting device which uses electroluminescence of an organic material, and an illumination apparatus and a display apparatus using the light-emitting device.

2. Description of the Related Art

Light-emitting devices (hereinafter referred to as organic EL devices) which use electroluminescence of an organic material have attracted attention as a light-emitting device capable of emitting high-luminance light with low-voltage direct-current driving and have been actively researched and developed. The organic EL device has a structure in which an organic layer having a light-emitting layer that generally has a thickness of about several tens to several hundreds of nm is interposed between a reflective electrode and a translucent electrode. In such an organic EL device, light emitted from the light-emitting layer is extracted to the outside after undergoing interference in the device structure. In the related art, several attempts have been made to improve emission efficiency of the organic EL device using such interference.

JP-A-2002-289358 discloses a technique in which a distance from an emission position to a reflective layer is set so as to allow light having an emission wavelength to resonate using interference of light emitted from a light-emitting layer towards a translucent electrode and light emitted towards a reflective electrode, thus enhancing emission efficiency.

JP-A-2000-243573 defines a distance from an emission position to a reflective electrode and the distance from the emission position to an interface between a translucent electrode and a substrate by taking reflection of light at the interface between the translucent electrode and the substrate into consideration.

WO01/039554 discloses a technique in which the thickness of a layer between a translucent electrode and a reflective electrode is set so as to allow light having a desired wavelength to resonate using interference of light occurring when light undergoes multiple reflections between the translucent electrode and the reflective electrode, thus enhancing emission efficiency.

Japanese Patent No. 3508741 discloses a method of controlling an attenuation balance of the three colors red (R), green (G), and blue (B) by controlling the thickness of an organic layer as a method of improving the viewing angle characteristics of a white chromaticity point in a display apparatus having a light-emitting device in which emission efficiency is enhanced using a cavity structure.

The techniques mentioned above are directed to an organic EL device which uses interference of emitted light in order to enhance emission efficiency. In such an organic EL device, when the bandwidth of an interference filter for extracted light h narrows, the wavelength of the light h shifts largely when the emission surface is viewed from an oblique direction, and the emission intensity decreases. Thus, the viewing-angle dependency of emission characteristics increases.

In contrast, JP-A-2006-244713 discloses a technique in which the phase of light emission by a reflective layer of an organic EL device having a narrow single-color spectrum and the interference by a single reflective layer provided on the light emitting side are set to be in an opposite phase to the central wavelength, thus suppressing a variation of hue in accordance with a viewing angle.

In an organic light-emitting device having white light-emitting layers stacked sequentially, since the interference as above occurs in the device, in order to effectively extract white emission having a wide wavelength component, it is preferable for the emission position to be positioned close to the reflective layer particularly at a distance of 80 nm or less. When the emission position is separated from the reflective layer and the distance increases, it is difficult to obtain white emission having a wide spectrum due to the interference.

JP-A-2004-79421 discloses a technique in which a distance from the emission position to a reflective layer and a distance from the emission position to the interface between a translucent electrode and an outer layer are defined so as to obtain a high-efficiency light-emitting device having excellent white chromaticity.

JP-A-2006-244712 discloses a technique which enables a good white chromaticity point to be obtained by adopting the interference of the opposite phase as disclosed in JP-A-2006-244713. However, since it is difficult to achieve phase cancellation over a wide wavelength range, similarly to JP-A-2006-244713, there is no discussion regarding suppression of a variation in hue in accordance with the viewing angle as compared to a single color.

JP-A-2006-173550, JP-T-2008-511100, and JP-T-2008-518400, for example, disclose a technique in which a plurality of light-emitting layers is stacked with an intermediate layer disposed therebetween in order to enhance emission efficiency and improve the light emission lifecycle, thus forming an organic layer so as to have a stacked structure (a so-called tandem structure) having light-emitting layers connected in series. In this type of organic layer, an arbitrary number of light-emitting layers can be stacked. In this case, particularly, by stacking a blue light-emitting layer generating blue light, a green light-emitting layer generating green light, and a red light-emitting layer generating red light, it is possible to generate white light as a combined light of the blue, green, and red light.

However, when the tandem structure as above is formed, it is difficult to make all the distances from the respective emission positions to the reflective layer to be 80 nm or less. Moreover, since the viewing-angle dependency of luminance and hue is very high, the intensity distribution properties of an illumination apparatus or the display properties of a display apparatus are greatly decreased.

SUMMARY OF THE INVENTION

It is therefore desirable to provide a light-emitting device capable of effectively extracting light in a wide wavelength range and greatly reducing a viewing-angle dependency of luminance and hue with respect to light of a single color or a combined color of plural colors.

It is also desirable to provide an illumination apparatus which has a small viewing-angle dependency and good intensity distribution properties.

It is also desirable to provide a display apparatus which has a high display quality and a small viewing-angle dependency.

According to an embodiment of the present invention, there is provided a light-emitting device including:

an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;

a first reflective interface which is provided on the side of the first electrode so as to reflect light emitted from the first light-emitting layer and the second light-emitting layer to be emitted from the side of the second electrode; and a second reflective interface and a third reflective interface which are sequentially provided on the side of the second electrode at mutually separated positions in that order in a direction from the first electrode to the second electrode, wherein an optical distance between the first reflective interface and a luminescent center of the first light-emitting layer is set so that light having a central wavelength of an emission spectrum of the first light-emitting layer is reinforced through interference between the first reflective interface and the luminescent center of the first light-emitting layer, wherein an optical distance between the first reflective interface and a luminescent center of the second light-emitting layer is set so that light having a central wavelength of an emission spectrum of the second light-emitting layer is reinforced through interference between the first reflective interface and the luminescent center of the second light-emitting layer, and wherein the reflection of light by the second reflective interface and the reflection of light by the third reflective interface occur so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened.

According to another embodiment of the present invention, there is provided an illumination apparatus including: at least one light-emitting device which includes an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;

a first reflective interface which is provided on the side of the first electrode so as to reflect light emitted from the first light-emitting layer and the second light-emitting layer to be emitted from the side of the second electrode; and a second reflective interface and a third reflective interface which are sequentially provided on the side of the second electrode at mutually separated positions in that order in a direction from the first electrode to the second electrode, wherein an optical distance between the first reflective interface and a luminescent center of the first light-emitting layer is set so that light having a central wavelength of an emission spectrum of the first light-emitting layer is reinforced through interference between the first reflective interface and the luminescent center of the first light-emitting layer, wherein an optical distance between the first reflective interface and a luminescent center of the second light-emitting layer is set so that light having a central wavelength of an emission spectrum of the second light-emitting layer is reinforced through interference between the first reflective interface and the luminescent center of the second light-emitting layer, and wherein the reflection of light by the second reflective interface and the reflection of light by the third reflective interface occur so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened.

According to still another embodiment of the present invention, there is provided a display apparatus including: at least one light-emitting device which includes an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;

a first reflective interface which is provided on the side of the first electrode so as to reflect light emitted from the first light-emitting layer and the second light-emitting layer to be emitted from the side of the second electrode; and a second reflective interface and a third reflective interface which are sequentially provided on the side of the second electrode at mutually separated positions in that order in a direction from the first electrode to the second electrode, wherein an optical distance between the first reflective interface and a luminescent center of the first light-emitting layer is set so that light having a central wavelength of an emission spectrum of the first light-emitting layer is reinforced through interference between the first reflective interface and the luminescent center of the first light-emitting layer, wherein an optical distance between the first reflective interface and a luminescent center of the second light-emitting layer is set so that light having a central wavelength of an emission spectrum of the second light-emitting layer is reinforced through interference between the first reflective interface and the luminescent center of the second light-emitting layer, and wherein the reflection of light by the second reflective interface and the reflection of light by the third reflective interface occur so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened.

In the light-emitting device according to the embodiment of the present invention, when the optical distance between the first reflective interface and the luminescent center of the first light-emitting layer is L11, the optical distance between the first reflective interface and the luminescent center of the second light-emitting layer is L21, an optical distance between the luminescent center of the first light-emitting layer and the second reflective interface is L12, an optical distance between the luminescent center of the second light-emitting layer and the second reflective interface is L22, an optical distance between the luminescent center of the first light-emitting layer and the third reflective interface is L13, an optical distance between the luminescent center of the second light-emitting layer and the third reflective interface is L23, the central wavelength of an emission spectrum of the first light-emitting layer is $\lambda 1$, and the central wavelength of an emission spectrum of the second light-emitting layer is $\lambda 2$, L11, L21, L12, L22, L13, and L23 are chosen so as to satisfy all the expressions (1) to (8) and at least one of the expressions (9) and (10). Here, the luminescent centers of the first light-emitting layer and the second light-emitting layer mean a plane where the peaks of the emission intensity distribution in the thickness direction thereof are positioned. In a light-emitting layer emitting light of a single color, the luminescent center is generally a plane that evenly divides the thickness thereof. In a light-emitting layer emitting light of two or more different colors, when the luminescent centers can be regarded as identical since the thickness of the layer emitting light of each color is sufficiently small, the luminescent center is generally the plane that evenly divides the thickness thereof.

$$2L11/\lambda 11+\phi 1/2\pi = m \quad (1)$$

$$2L21/\lambda 21+\phi 1/2\pi = n \text{(where } n \geq m+1\text{)} \quad (2)$$

$$2L12/\lambda 12+\phi 2/2\pi = m'+1/2 \quad (3)$$

$$2L22/\lambda 22+\phi 2/2\pi = n'+1/2 \quad (4)$$

$$2L13/\lambda 13+\phi 3/2\pi = m''+1/2 \quad (5)$$

$$2L23/\lambda 23+\phi 3/2\pi = n''+1/2 \quad (6)$$

$$\lambda 1-30 < \lambda 11 < \lambda 1+80 \quad (7)$$

$$\lambda 2-30 < \lambda 21 < \lambda 2+80 \quad (8)$$

$$\lambda 12 \leq \lambda 1-15 \text{ and } \lambda 13 \geq \lambda 1+15, \text{ or } \lambda 13 \leq \lambda 1-15 \text{ and } \lambda 12 \geq \lambda 1+15 \quad (9)$$

$$\lambda 22 \leq \lambda 2-15 \text{ and } \lambda 23 \geq \lambda 2+15, \text{ or } \lambda 23 \leq 2-15 \text{ and } \lambda 22 \geq \lambda 2+15 \quad (10)$$

where m, m', m", n, n', n" are integers, $\lambda 1$, $\lambda 2$, $\lambda 11$, $\lambda 21$, $\lambda 12$, $\lambda 22$, $\lambda 13$, and $\lambda 23$ are in units of nm, $\phi 1$ is a phase shift occurring when light of each wavelength is reflected by the first reflective interface, $\phi 2$ is a phase shift occurring when light of each wavelength is reflected by the second reflective interface, and $\phi 3$ is a phase shift occurring when light of each wavelength is reflected by the third reflective interface.

The expression (1) is an expression for setting the optical distance between the first reflective interface and the luminescent center of the first light-emitting layer so that light having the central wavelength of the emission spectrum of the first light-emitting layer is reinforced through interference between the first reflective interface and the luminescent center of the first light-emitting layer. The expression (2) is an expression for setting the optical distance between the first reflective interface and the luminescent center of the second light-emitting layer so that light having the central wavelength of the emission spectrum of the second light-emitting layer is reinforced through interference between the first reflective interface and the luminescent center of the second light-emitting layer. The expressions (3) to (6) are expressions for setting the reflection of light by the second reflective interface and the reflection of light by the third reflective interface so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened. The values of $\lambda 11$, $\lambda 21$, $\lambda 12$, $\lambda 22$, $\lambda 13$, $\lambda 23$ in the expressions (1) to (6) are calculated from the values of $\lambda 1$ and $\lambda 2$ by the expressions (7) to (10).

The integers m, m', m", n, n', and n" are chosen as necessary. In order to increase the amount of light extracted from the light-emitting device, the integers m and n are preferably set as $(m, n) \leq 5$, and are preferably set as $m \leq 4$ and $n \leq 5$ considering the fact that $n \geq m+1$. More preferably, the values are set as m=0 and n=1 or n=2.

According to this light-emitting device, the peaks of the spectral transmittance curve of an interference filter can be made substantially flat in the visible wavelength region, or the slopes thereof can be made substantially the same in the wavelength range of all emission colors. Particularly, by configuring the light-emitting device so that all the expressions (1) to (8) are satisfied and at least one of the expressions (9) and (10) is satisfied, a decrease of luminance at a viewing angle of 45° can be controlled to be 30% or less with respect to luminance at a viewing angle of 0°, and a chromaticity shift of $\Delta uv \leq 0.015$ can be obtained.

When the first light-emitting layer or the second light-emitting layer emits light of two or more different colors, it is preferable that the difference between the wavelengths (peak wavelengths of the emission spectrum) of the light having different colors is generally within 120 nm. However, the difference is not limited to that value.

This light-emitting device may be a top emission-type light-emitting device and may be a bottom emission-type light-emitting device. In a top emission-type light-emitting device, the first electrode, the organic layer, and the second electrode are sequentially stacked on a substrate. In a bottom emission-type light-emitting device, the second electrode, the organic layer, and the first electrode are sequentially stacked on a substrate. The substrate of the top emission-type light-emitting device may be opaque or transparent, which is chosen as necessary. The substrate of the bottom emission-type light-emitting device is transparent in order to extract light emitted from the side of the second electrode to the outside.

A metal layer having a thickness allowing transmission of visible light may be provided between the second light-emitting layer and the second electrode as necessary. The thickness of the metal layer may be 5 nm or less, and preferably 3 to 4 nm or less. The metal layer can be used as a semitransparent reflective layer.

One or plural reflective interfaces may be provided in addition to the first, second, and third reflective interfaces, as necessary. Moreover, at least one of the first, second, and third reflective interfaces may be divided into a plurality of reflective interfaces, as necessary. By doing so, it is possible to broaden a wavelength range in which the reflection of light by the second reflective interface and the reflection of light by the third reflective interface are weakened and widening the flat portions of the peaks of the spectral transmittance curve of the interference filter for each emission region, thus improving the viewing angle characteristics.

When the luminescent centers of light-emitting layers of the first or second light-emitting layer emitting light of two or more different colors may not be regarded as identical, the light-emitting device preferably further includes a reflective layer which is provided so as to maintain the flatness of the peaks of a spectral transmittance curve of an interference filter of the light-emitting device. The reason why the luminescent centers of the light-emitting layers emitting light of two or more different colors may not be regarded as identical may be based on the fact that the thickness of the layers emitting light of each color is thick or may be based on the stacking order of these layers.

In this light-emitting device, there is a case where an additional reflective layer is formed so as to improve reliability or comply with an employed configuration, and thus an additional reflective interface is formed. In that case, by forming a third reflective interface necessary for an optical operation and then forming a layer having a thickness of at least 1 µm or more, it is possible to substantially ignore the effect of subsequent interference. At that time, an arbitrary material can be used as a material of the outer side of the third reflective interface and the material can be appropriately chosen in accordance with the type of the light-emitting device. Specifically, at least one or two or more of a transparent electrode layer having a thickness of 1 μm or more, a transparent insulating layer, a resin layer, a glass layer, and an air layer is formed on the outer side of the third reflective interface.

The illumination apparatus and the display apparatus according to the embodiments of the present invention may have the known configuration and can be appropriately configured in accordance with the purposes or functions thereof. As a typical example, the display apparatus includes a driving substrate on which an active device (for example, a thin-film transistor) is provided so as to supply a display signal corresponding to every display pixel to the light-emitting device, and a sealing substrate provided so as to face the driving substrate. The light-emitting device is disposed between the driving substrate and the sealing substrate. The display apparatus may be a white display apparatus, a black-and-white display apparatus, or a color display apparatus. In a color display apparatus, a color filter which transmits light emitted from the side of the second electrode is typically provided on a substrate that is disposed on the side of the second electrode of the light-emitting device among the driving substrate and the sealing substrate.

According to the embodiments of the present invention, it is possible to realize providing a light-emitting device capable of effectively extracting light in a wide wavelength range and greatly reducing a viewing-angle dependency of luminance and hue with respect to light of a single color or a combined color of two or more different colors.

According to the embodiments of the present invention, by using the light-emitting device, it is possible to realize an illumination apparatus which has a small viewing-angle dependency and good intensity distribution properties and a display apparatus which has a high display quality and a small viewing-angle dependency.

DESCRIPTION OF THE PREFERRED EMBODIMENTS

Hereinafter, modes for carrying out the present invention (hereinafter referred to as embodiments) will be described. The description will be given in the following order:
1. First Embodiment (Organic EL Device);
2. Second Embodiment (Organic EL Device);
3. Third Embodiment (Organic EL Device);
4. Fourth Embodiment (Organic EL Illumination apparatus); and
5. Fifth Embodiment (organic EL display apparatus)

1. First Embodiment

<Organic EL Device>

Figure 1:
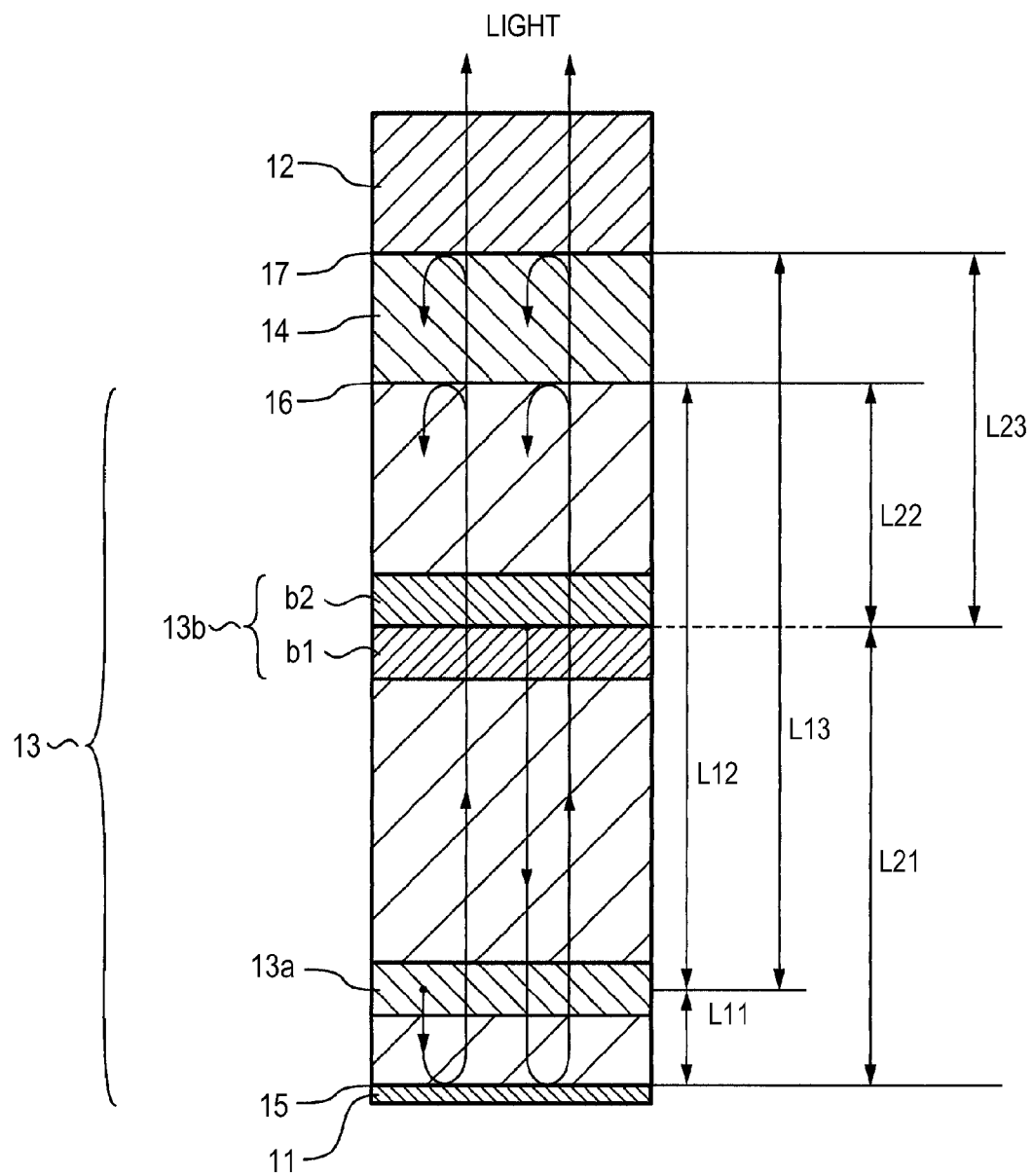
FIG. 1 is a sectional diagram showing an organic EL device according to a first embodiment of the present invention.

FIG. 1 shows an organic EL device according to a first embodiment.

As shown in FIG. 1, in this organic EL device, an organic layer 13 is interposed between a first electrode 11 and a second electrode 12, in which a first light-emitting layer 13a and a second light-emitting layer 13b are sequentially included in the organic layer 13 at mutually separated positions in that order in the direction from the first electrode 11 to the second electrode 12. Like the existing organic EL device, a hole injection layer, a hole transport layer, an electron transport layer, an electron injection layer, and the like, as necessary, are formed in portions of the organic layer 13 above or under the first light-emitting layer 13a and above or under the second light-emitting layer 13b. In this case, the second electrode 12 is a transparent electrode that transmits visible light, and light is emitted from the side of the second electrode 12. The first light-emitting layer 13a and the second light-emitting layer 13b emit light of single colors or two or more different colors of which the difference between the wavelengths thereof is within 120 nm. The emission wavelengths of the first light-emitting layer 13a and the second light-emitting layer 13b are appropriately chosen in accordance with the color of light that is to be emitted from the organic EL device. In general, the emission wavelengths of the first and second light-emitting layers 13a and 13b preferably sequentially increase in the direction from the first electrode 11 to the second electrode 12, but the present invention is not limited to this. In this embodiment, the first light-emitting layer 13a emits light of a single color, and the second light-emitting layer 13b emits light of two different colors. In this case, the second light-emitting layer 13b is formed by two light-emitting layers b1 and b2 that emit light of different colors. For example, when this organic EL device is used as a white light-emitting device, the first light-emitting layer 13a emits blue light, and the second light-emitting layer 13b emits light of green and red. The thicknesses of the light-emitting layers b1 and b2 are chosen to be sufficiently small so that the luminescent centers of the light-emitting layers b1 and b2 can be regarded as identical. A conductive transparent layer 14 is formed between the organic layer 13 and the second electrode 12. The transparent layer 14 may be formed by two or more layers, as necessary. The first and second electrodes 11 and 12, the organic layer 13, the first and second light-emitting layers 13a and 13b, and the transparent layer 14 can be formed by known materials, and the materials thereof are appropriately chosen as necessary.

The refractive index of the organic layer 13 is different from the refractive index of the first electrode 11, and a first reflective interface 15 is formed between the first electrode 11 and the organic layer 13 due to the difference in the refractive index. The first reflective interface 15 may be formed at a position separated from the first electrode 11, as necessary. The first reflective interface 15 has a function of reflecting light emitted from the first light-emitting layer 13a and the second light-emitting layer 13b to be emitted from the side of the second electrode 12. The refractive index of the transparent layer 14 is different from the refractive index of the organic layer 13, and a second reflective interface 16 is formed between the organic layer 13 and the transparent layer 14 due to the difference in the refractive index. Moreover, the refractive index of the transparent layer 14 is different from the refractive index of the second electrode 12, and a third reflective interface 17 is formed between the transparent layer 14 and the second electrode 12 due to the difference in the refractive index.

In FIG. 1, L11, L21, L12, L22, L13, and L23 are illustrated at corresponding positions. In the organic EL device, L11, L21, L12, L22, L13, and L23 are set so that all the expressions (1) to (8) are satisfied and at least one of the expressions (9) and (10) is satisfied.

A case where the organic EL device is a white light-emitting device will be described in detail.

In the white organic EL device, the first light-emitting layer 13a emits blue light, the second light-emitting layer 13b emits light of green and red, and white light is extracted as a combined color of these colors. The central wavelength λ1 of the emission spectrum of the first light-emitting layer 13a is 460 nm, for example, and the central wavelength λ2 of the emission spectrum of the second light-emitting layer 13b is 575 nm, for example.

L11 is set so that light having the central wavelength λ1 of the emission spectrum of the first light-emitting layer 13a is reinforced through interference between the first reflective interface 15 and the luminescent center of the first light-emitting layer 13a. Moreover, L21 is set so that light having the central wavelength λ2 of the emission spectrum of the second light-emitting layer 13b is reinforced through interference between the first reflective interface 15 and the luminescent center of the second light-emitting layer 13b. This state can be expressed as the following expressions, and the expressions (1), (2), (7), and (8) are satisfied.

$$2L11/\lambda 11 + \phi 1/2\pi = 0 \quad (1)'$$

$$2L21/\lambda 21 + \phi 1/2\pi = 1 \quad (2)'$$

where, $$\lambda 11 = \lambda 1 = 460 \text{ nm} \quad (7)'$$

$$\lambda 2 - 30 = 545 < \lambda 21 = 600 < \lambda 2 + 80 = 655 \text{ nm} \quad (8)'$$

In the expressions, $\phi 1$ can be calculated from n and k of a complex refractive index $N = n - jk$ (n: refractive index, k: absorption coefficient) of the first electrode 11 and the refractive index $n_0$ of the organic layer 13 in contact with the first electrode 11 (see, for example, Principles of Optics, Max Born and Emil Wolf, 1974 (PERGAMON PRESS)). The refractive indices of the organic layer 13, the transparent layer 14, and the like can be measured using a spectroscopic ellipsometer.

A specific calculation example of $\phi 1$ will be described. When the first electrode 11 is made from an aluminum (Al) alloy, n=0.570 and k=4.725 for light having a wavelength of 460 nm (corresponding to the central wavelength λ1 of the emission spectrum of the first light-emitting layer 13a). When the refractive index $n_0$ of the organic layer 13 is set as $n_0$=1.75, the following expression is obtained.

$$\phi 1 = \tan^{-1}\{2n_0 k/(n^2 + k^2 - n_0^2)\}$$
$$= \tan^{-1}(0.7301)$$

Since $-2\pi < \phi 1 \leq 0$, $\phi 1$ can be calculated as $\phi 1 = -2.511$ radians. When the value of $\phi 1$ is substituted into the expression (1)', L11 is calculated as L11=92 nm. Moreover, when the value of $\phi 1$ is substituted into the expression (2)', L21 is calculated as L21=322 nm.

When the refractive index n of the first electrode 11 is larger than the refractive index $n_0$ of the organic layer 13, $\phi 1$ is shifted further by an amount of π radians. When the refractive index n is smaller than the refractive index $n_0$, the shift amount is 0.

Figure 2:
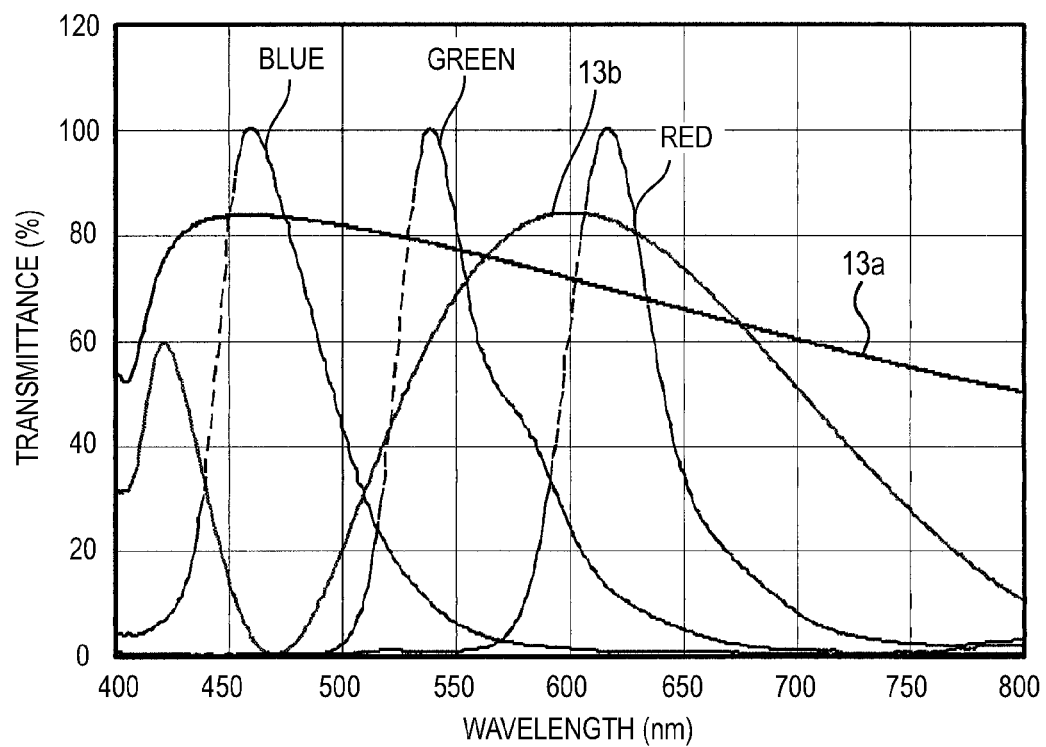
FIG. 2 is a schematic diagram showing the spectral transmittance curves of an interference filter formed by a first reflective interface in the organic EL device according to the first embodiment of the present invention.

Since the interference filter formed by the first reflective interface 15 is in the constructive condition, the spectral transmittance curves have peaks as shown in FIG. 2, and light extraction efficiency is improved. However, when observed from the oblique direction, the wavelength range of the interference filter is shifted towards the short wavelengths, and luminance and hue are changed. In addition, since the wavelength range of the interference filter corresponding to the second light-emitting layer 13b is narrow, light of green (G) and red (R) may not be sufficiently extracted.

Subsequently, the second reflective interface 16 is formed between the organic layer 13 having the refractive index $n_0$=1.75 and the transparent layer 14 having a refractive index (for example, 2.2) different from the organic layer 13, and the third reflective interface 16 is formed between the transparent layer 14 and the second electrode 12 having a refractive index (for example, 2.0) different from the transparent layer 14. Niobium oxide can be used as a material of the transparent layer 14 having the refractive index of 2.2, and ITO (Indium Tin Oxide) can be used as a material of the second electrode 12 having the refractive index of 2.0. In this case, the reflection of light by the second reflective interface 16 and the reflection of light by the third reflective interface 17 satisfy a condition such that the light having wavelengths shifted by an amount of +15 nm or more and −15 nm or less from the central wavelengths λ1 and λ2 is weakened.

$$2L12/\lambda 12+\phi 2/2\pi=2+1/2 \quad (3)'$$

$$2L22/\lambda 22+\phi 2/2\pi=0+1/2 \quad (4)'$$

$$2L13/\lambda 13+\phi 3/2\pi=3+1/2 \quad (5)'$$

$$2L23/\lambda 23+\phi 3/2\pi=1+1/2 \quad (6)'$$

$$\lambda 12=436 \leq \lambda 1-15=460-15=445 \text{ and } \lambda 13=510 \geq \lambda 1+15=460+15=475 \quad (9)'$$

$$\lambda 22=520 \leq \lambda 2-15=575-15=560 \text{ and } \lambda 23=653 \geq \lambda 2+15=575+15=590 \quad (10)'$$

(where λ12, λ22, λ13, and λ23 are in units of nm)

The values of φ2 and φ3 can be calculated by the same manner as above.

In this way, all the conditions of the expressions (1) to (10) are satisfied.

Figure 3:
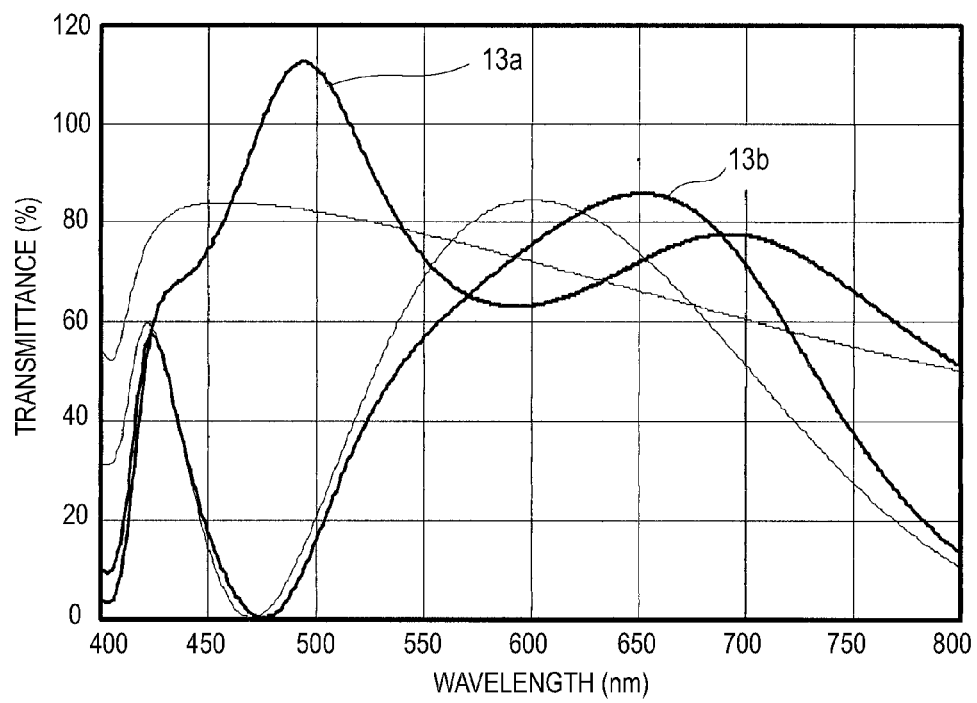
FIG. 3 is a schematic diagram showing spectral transmittance curves of an interference filter formed by a first reflective interface and a combined interference filter formed by first and second reflective interfaces in the organic EL device according to the first embodiment of the present invention.

FIG. 3 shows the spectral transmittance curves of the interference filter formed by the first and second reflective interfaces 15 and 16. In this case, since the wavelength conditions of the first and second reflective interfaces 15 and 16 are different by an amount of 15 nm or more, the transmittance decreases in a wavelength near 550 nm. Thus, the light of the three colors R, G, and B may not be extracted in a well balanced manner, and white light may not be obtained. In addition, since a flat portion may not be obtained in the spectral transmittance curve, the viewing angle characteristics exhibit a great change from luminance and hue.

Figure 4:
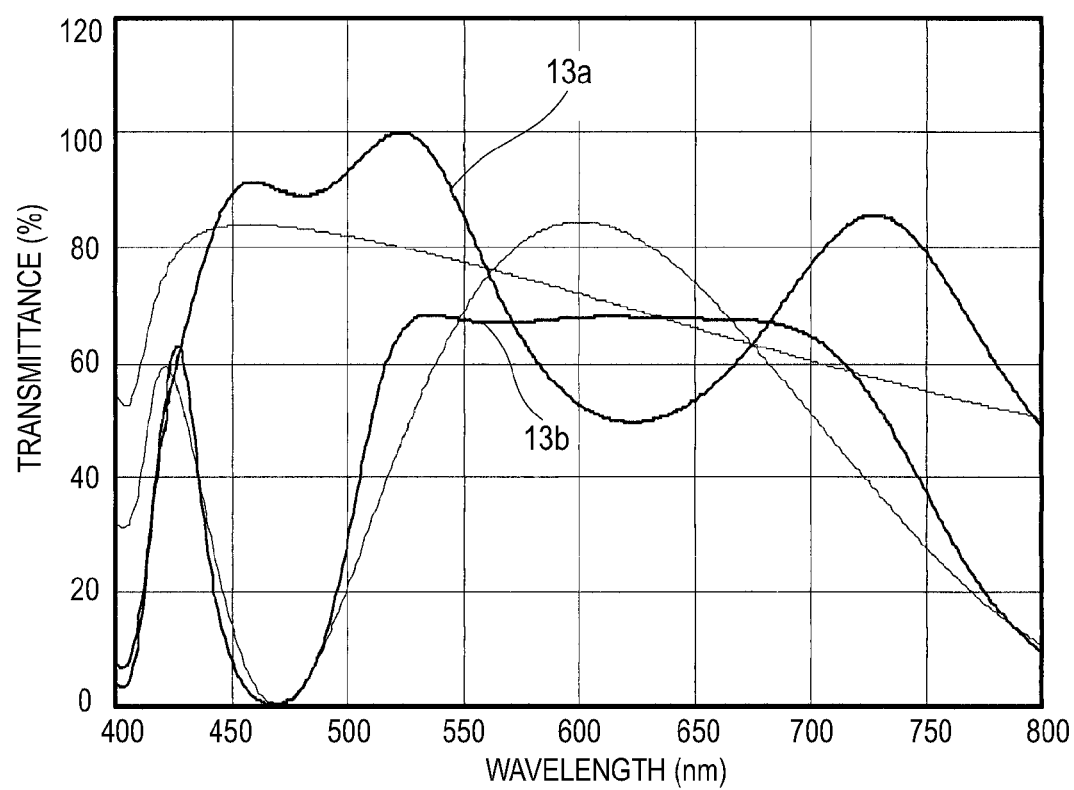
FIG. 4 is a schematic diagram showing the spectral transmittance curves of a combined interference filter formed by first, second, and third reflective interfaces in the organic EL device according to the first embodiment of the present invention.
Figure 5:
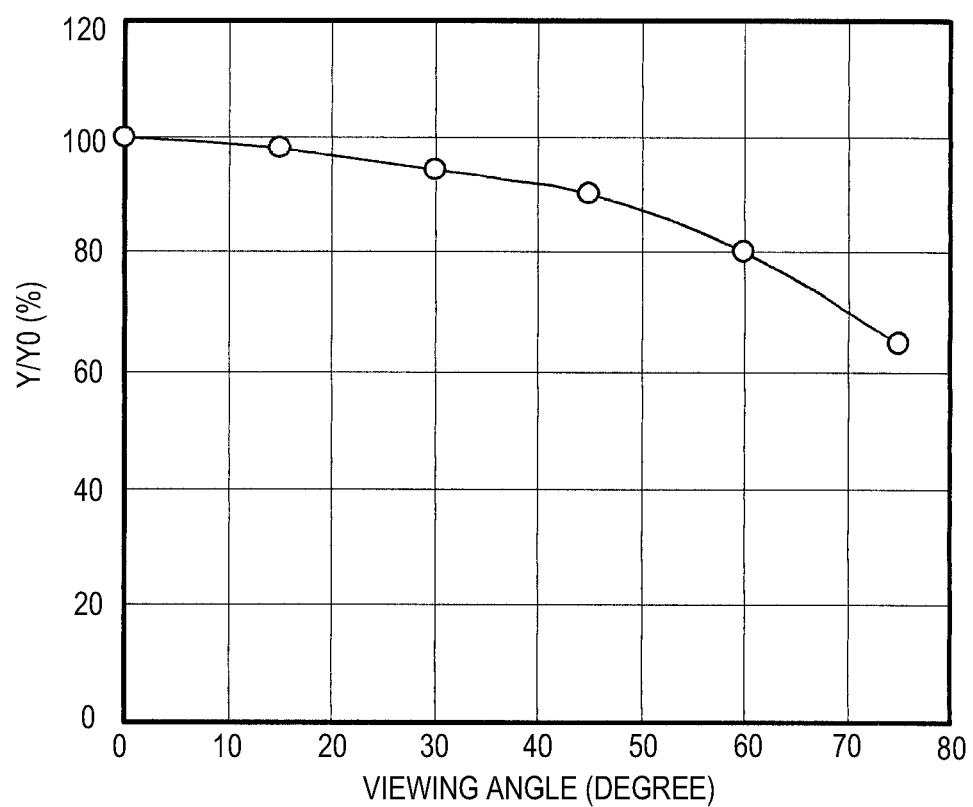
FIG. 5 is a schematic diagram showing the luminance-viewing angle characteristics of the organic EL device according to the first embodiment of the present invention.
Figure 6:
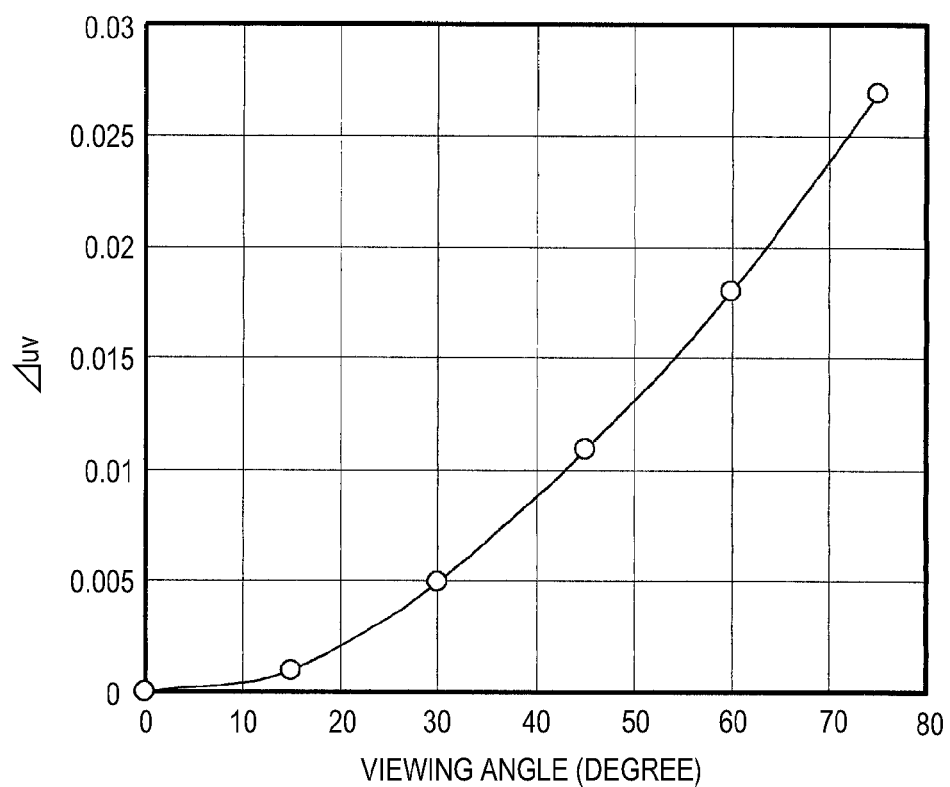
FIG. 6 is a schematic diagram showing the chromaticity-viewing angle characteristics of the organic EL device according to the first embodiment of the present invention.

FIG. 4 shows the spectral transmittance curves of an interference filter which is formed by the first and second reflective interfaces 15 and 16, and in which the effect of the third reflective interface 17 is included. It can be understood from FIG. 4 that an interference filter of which the spectral transmittance curve is substantially flat in the blue region and the green and red regions is formed. The luminance and chromaticity-viewing angle characteristics in that state are shown in FIGS. 5 and 6, respectively. As is clear from FIGS. 5 and 6, the luminance at the viewing angle of 45° maintains 85% or more of the luminance at the viewing angle of 0°, and a chromaticity shift of Δuv≦0.015 is also achieved.

As described above, according to the first embodiment, light having the central wavelength λ1 of the emission spectrum of the first light-emitting layer 13a is reinforced through interference between the first reflective interface 15 and the luminescent center of the first light-emitting layer 13a. Moreover, light having the central wavelength λ2 of the emission spectrum of the second light-emitting layer 13b is reinforced through interference between the first reflective interface 15 and the luminescent center of the second light-emitting layer 13b. Furthermore, the reflection of light by the second reflective interface 16 and the reflection of light by the third reflective interface 17 occur so that light having wavelengths shifted by an amount of +15 nm or more and −15 nm or less from at least one of the central wavelength λ1 of the emission spectrum of the first light-emitting layer 13a and the central wavelength λ2 of the emission spectrum of the second light-emitting layer 13b is weakened. As a result, this organic EL device has an interference filter of which the transmittance is high over a wide wavelength range and thus can effectively extract light in a wide wavelength range. Therefore, according to this organic EL device, a white light-emitting device having good hue can be realized. Moreover, this organic EL device can achieve a remarkable reduction in the viewing-angle dependency of luminance and hue for a single color or a combined color of two or more different colors. Furthermore, this organic EL device can allow choice of an emission color by designing the first and second light-emitting layers 13a and 13b. In addition, this organic EL device consumes less power since the transmittance of the interference filter is high.

2. Second Embodiment

<Organic EL Device>

In an organic EL device according to a second embodiment, the second and third reflective interfaces 16 and 17 of the organic EL device according to the first embodiment are respectively divided into two front and rear reflective interfaces so as to broaden the wavelength range of the opposite-phase interference conditions shown in the expressions (3) to (6). That is, as for the expression (3), for example, when the second reflective interface 16 is divided into two front and rear reflective interfaces separated by a distance of Δ, L12 becomes L12+Δ and L12−Δ, the wavelength range of λ12 in which the expression (3) is satisfied is broadened. The same applies to the expressions (4) to (6).

According to the second embodiment, in addition to the same advantages as the first embodiment, since the wavelength range of the opposite-phase interference condition shown in the expressions (3) to (6) can be broadened, it is possible to obtain an advantage that the viewing angle characteristics of the organic EL device can be improved further.

3. Third Embodiment

<Organic EL Device>

In the organic EL device according to the first embodiment, there is a case where the portions of the light-emitting layers b1 and b2 of the second light-emitting layer 13b are formed by a stacked structure made up of a plurality of layers depending on a manufacturing method of the organic EL device or in order to obtain necessary properties. Thus, the portions become thick. Moreover, as for the stacking order of the green light-emitting layer b1 and the red light-emitting layer b2, it is preferable to stack the layers in the descending order of the emission wavelength from the side of the first electrode 11. That is, the green light-emitting layer b1 and the red light-emitting layer b2 are preferably stacked in that order from the side of the first electrode 11 similarly to the first embodiment. However, the stacking order of the green light-emitting layer b1 and the red light-emitting layer b2 may be reversed. In such a case, since it is difficult to regard the luminescent center of the light-emitting layer b1 to be identical to the luminescent center of the light-emitting layer b2, it is difficult to maintain wide-viewing angle characteristics. As for a countermeasure, the viewing angle characteristics can be improved by additionally providing a fourth reflective interface in addition to the first, second, and third reflective interfaces 15, 16, and 17 of the organic EL device according to the first embodiment.

Figure 7A:
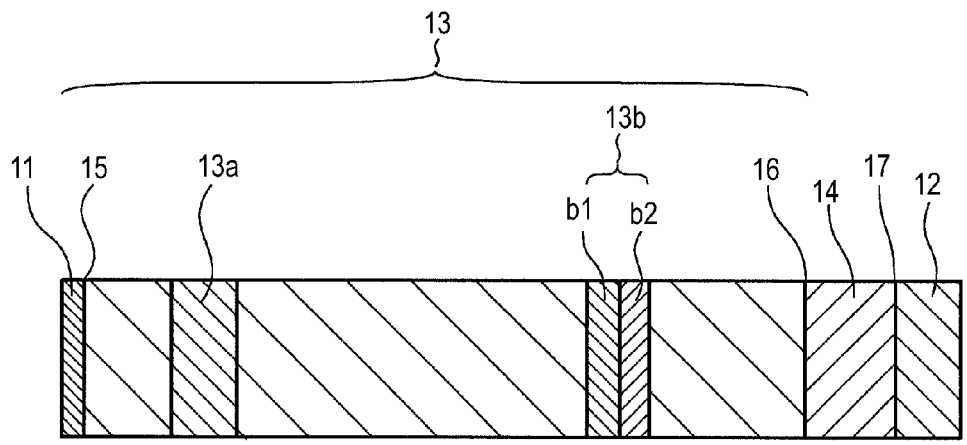
FIGS. 7A and 7B are sectional diagrams showing a case where a second light-emitting layer of the organic EL device according to the first embodiment of the present invention is thick so that the luminescent centers may not be regarded as identical.
Figure 7B:
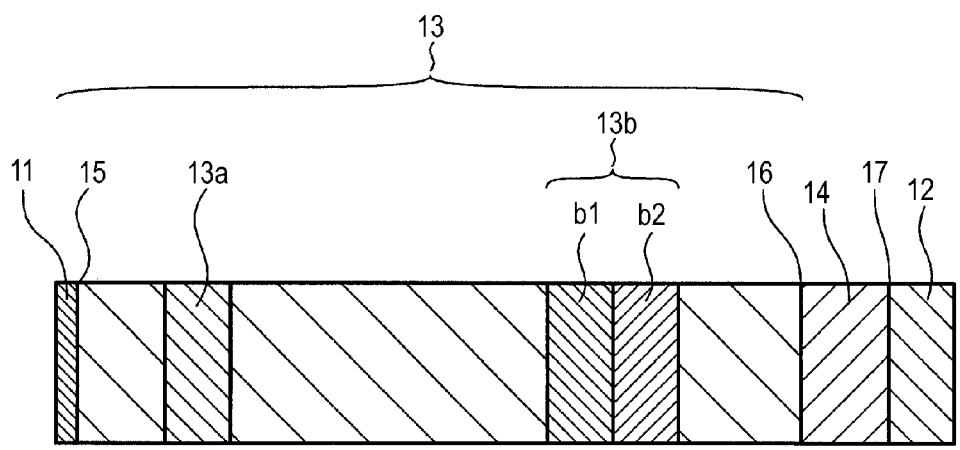
Figure 8:
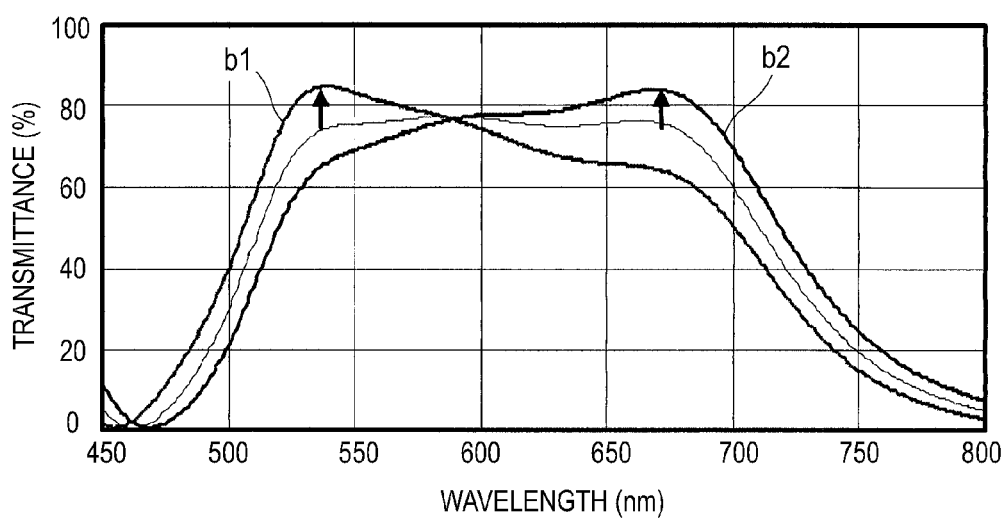
FIG. 8 is a schematic diagram showing the spectral transmittance curves of an interference filter corresponding to the second light-emitting layer of the organic EL device according to the first embodiment of the present invention shown in FIGS. 7A and 7B.

In the fourth reflective interface, depending on the stacking order of the first and second light-emitting layers 13a and 13b, both the constructive and destructive conditions exist in the range of the central wavelength±15 nm of these first and second light-emitting layers 13a and 13b. FIG. 7A shows the organic EL device according to the first embodiment. In this case, the thicknesses of the green light-emitting layer b1 and the red light-emitting layer b2 of the second light-emitting layer 13b are sufficiently small, and the luminescent center of the light-emitting layer b1 can be regarded as identical to the luminescent center of the light-emitting layer b2. In contrast, as shown in FIG. 7B, when the thicknesses of the green light-emitting layer b1 and the red light-emitting layer b2 of the second light-emitting layer 13b are relatively as large as 20 nm, the luminescent centers of these light-emitting layers b1 and b2 are regarded as shifted from each other. As a result, as shown in FIG. 8, slopes in mutually opposite directions appear in the spectral transmittance curves of the interference filters corresponding to the green light-emitting layer b1 and the red light-emitting layer b2. Therefore, as the viewing angle increases, the transmittance of green light decreases whereas the transmittance of red light increases. Thus, a color shift occurs.

Figure 9:
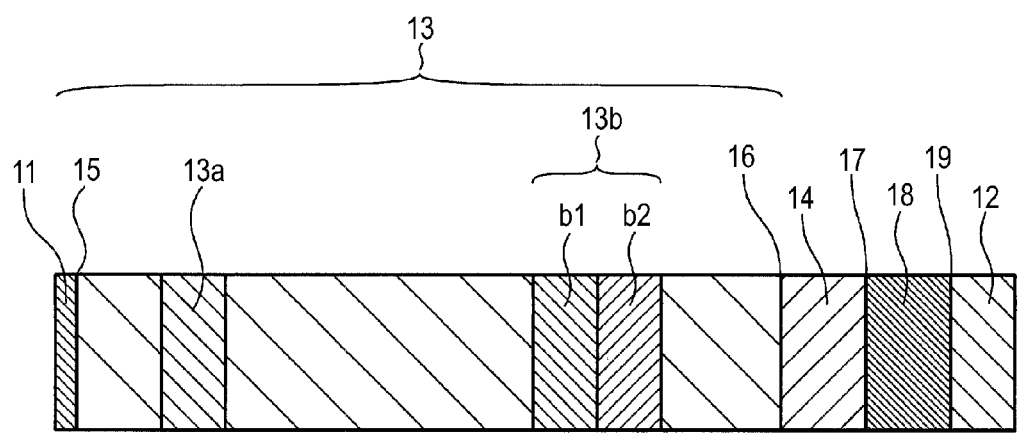
FIG. 9 is a sectional diagram showing an organic EL device according to a third embodiment of the present invention.
Figure 10:
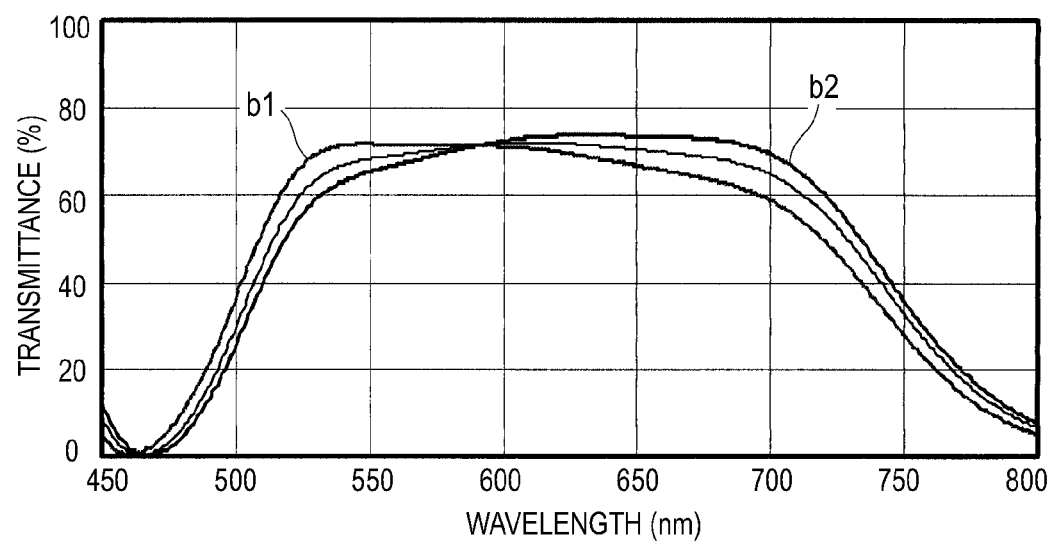
FIG. 10 is a schematic diagram showing the spectral transmittance curves of an interference filter corresponding to a second light-emitting layer of the organic EL device according to the third embodiment of the present invention.

In the organic EL device according to the third embodiment, as shown in FIG. 9, a conductive transparent layer 18 having a refractive index different from the transparent layer 14 is formed on the transparent layer 14, and the second electrode 12 is formed on the transparent layer 18. Moreover, a fourth reflective interface 19 is formed between the transparent layer 18 and the second electrode 12. In this case, the third reflective interface 17 is formed between the transparent layer 14 and the transparent layer 18. The fourth reflective interface 19 is set at a position such that light having the central wavelength λ2 of the emission spectrum of the second light-emitting layer 13b is in the constructive condition. By doing so, the interference filters corresponding to the green light-emitting layer b1 and the red light-emitting layer b2 have the spectral transmittance curves as shown in FIG. 10. Thus, it can be understood that an interference filter having a flat peak can be formed for light of the colors green and red.

When the stacking order of the green light-emitting layer b1 and the red light-emitting layer b2 is reversed, the same advantage as above can be obtained by forming the fourth reflective interface 19 at a position such that light having the central wavelength λ2 of the emission spectrum of the second light-emitting layer 13b is in the destructive condition.

Figure 11:
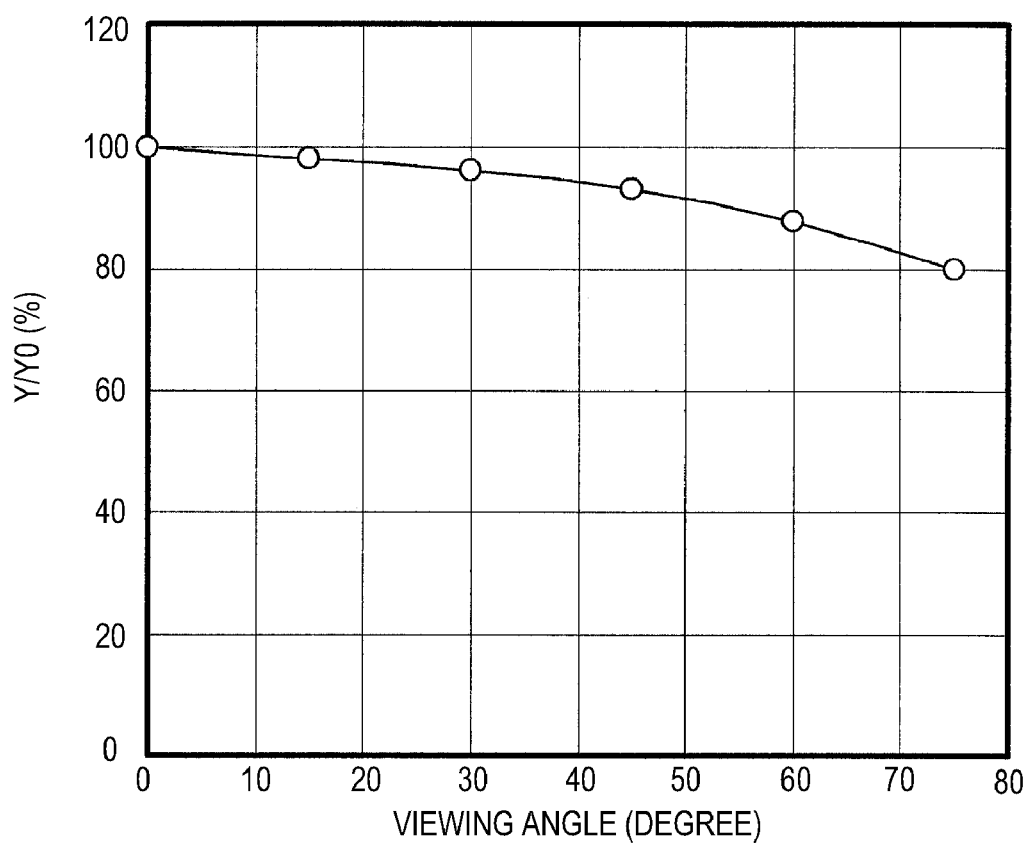
FIG. 11 is a schematic diagram showing the luminance-viewing angle characteristics of the organic EL device according to the third embodiment of the present invention.
Figure 12:
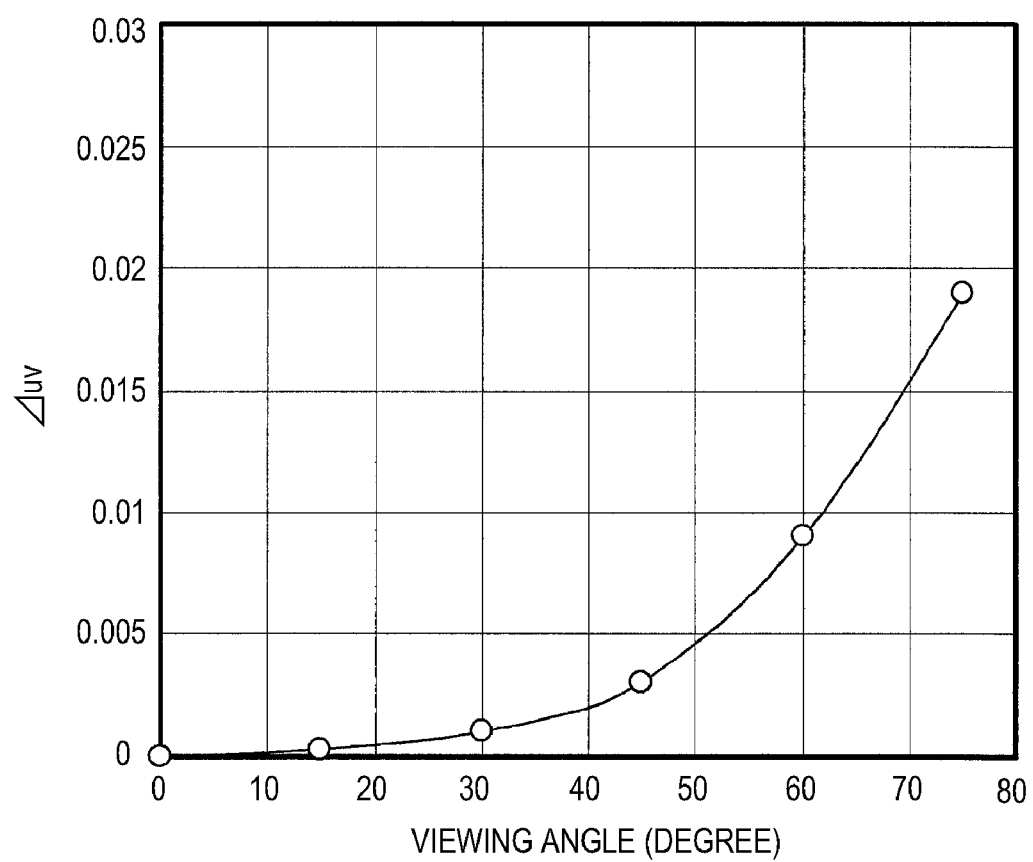
FIG. 12 is a schematic diagram showing the chromaticity-viewing angle characteristics of the organic EL device according to the third embodiment of the present invention.

The luminance and chromaticity-viewing angle characteristics of the organic EL device according to the third embodiment having the fourth reflective interface 19 are shown in FIGS. 11 and 12. It can be understood from FIGS. 11 and 12 that according to this organic EL device, the luminance and chromaticity-viewing angle characteristics are improved further as compared with the organic EL device according to the first embodiment.

Example 1

Example 1 is an example corresponding to the first embodiment.

Figure 13:
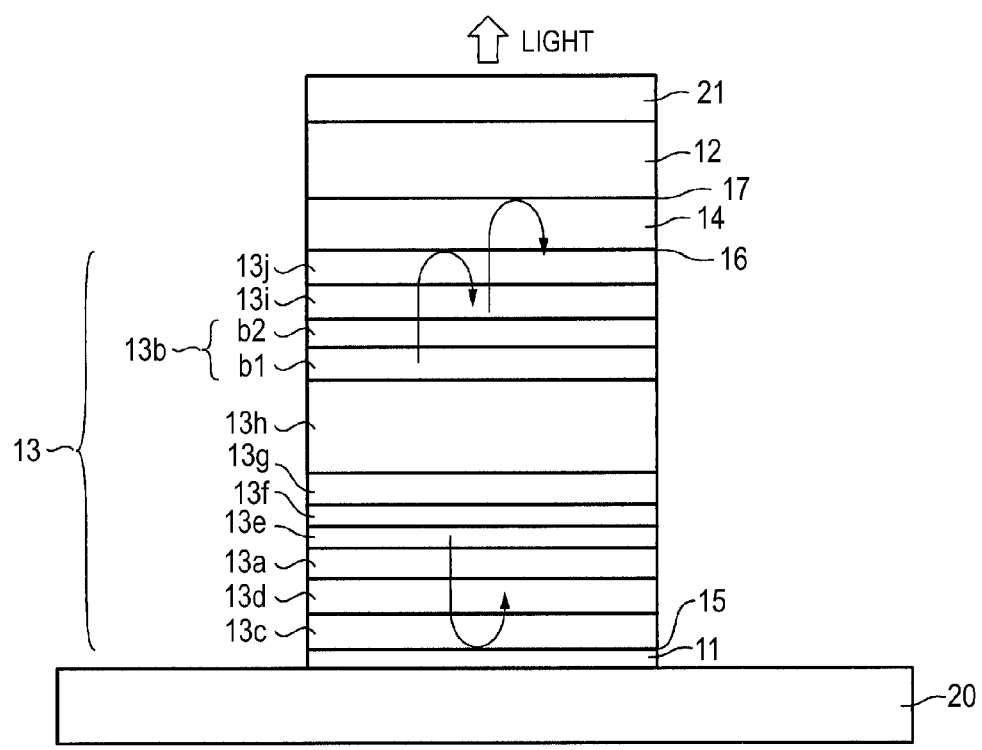
FIG. 13 is a sectional diagram showing a top emission-type organic EL device according to Example 1.

FIG. 13 shows an organic EL device according to Example 1. This organic EL device is a top emission-type organic EL device. As shown in FIG. 13, in this organic EL device, a first electrode 11, an organic layer 13, a transparent layer 14, and a second electrode 12 are sequentially stacked on a substrate 20 in that order from the lower side, and a passivation film 21 is formed on the second electrode 12.

The substrate 20 is formed, for example, of a transparent glass substrate or a semiconductor substrate (for example, a silicon substrate) and may be flexible. The first electrode 11 is an anode electrode also serving as a reflective layer and is formed from a light reflective material, for example, aluminum (Al), aluminum alloy, platinum (Pt), gold (Au), chromium (Cr), and tungsten (W). The thickness of the first electrode 11 is preferably set to be in the range of 100 to 300 nm. The first electrode 11 may be a transparent electrode. In this case, it is preferable to form a reflective layer made from a light reflective material, for example, Pt, Au, Cr, and W, for the purpose of forming the first reflective interface 15 opposing the substrate 20.

The organic layer 13 has a structure in which a hole injection layer 13c, a hole transport layer 13d, a first light-emitting layer 13a, an electron transport layer 13e, an electron injection layer 13f, a connection layer 13g, a hole transport layer 13h, a second light-emitting layer 13b, an electron transport layer 13i, and an electron injection layer 13j are sequentially stacked in that order from the lower side. The hole injection layer 13c is formed, for example, from hexaazatriphenylene (HAT) or the like. The hole transport layer 13d is formed, for example, from α-NPD [N,N'-di(1-naphthyl)-N,N'-diphenyl-[1,1'-biphenyl]-4,4'-diamine]. The first light-emitting layer 13a is formed from a light emitting material having the blue (B) emission color. Specifically, ADN (9,10-di(2-naphthyl)anthracene) is deposited as a host material to form a film having a thickness of 20 nm. At that time, a diaminochrysene derivative is doped into the ADN as an impurity material by an amount of 5% in the relative thickness ratio, whereby the film can be used as a blue light-emitting layer. The electron transport layer 13e is formed, for example, from BCP (2,9-dimethyl-4,7-diphenyl-1,10-phenanthroline). The electron injection layer 13f is formed, for example, from lithium fluoride (LiF). The connection layer 13g is formed, for example, from Alq3 (8-hydroxyquinoline aluminum) doped with Mg (5%) and hexaazatriphenylene (HAT) or the like. The hole transport layer 13h also serving as the hole injection layer is formed, for example, from α-NPD. The green light-emitting layer b1 of the second light-emitting layer 13b is formed, for example, from Alq3 (tris-quinolinolaluminum complex), and the red light-emitting layer b2 is formed, for example, from a material obtained by doping pyrromethene-boron complex into rubrene used as a host material. The electron transport layer 13i is formed, for example, of BCP. The electron injection layer 13j is formed, for example, of LiF.

The thickness of each layer of the organic layer 13 is preferably set in the ranges of 1 to 20 nm for the hole injection layer 13c, 15 to 100 nm for the hole transport layer 13d, 5 to 50 nm for the first and second light-emitting layers 13a and 13b, and 15 to 200 nm for the electron injection layers 13f and 13j and the electron transport layers 13e and 13i. The thicknesses of the organic layer 13 and each constituent layer are set to a value such that the optical film thicknesses thereof enable the above-mentioned operations.

The second reflective interface 16 is formed by forming a conductive transparent layer 14 on the organic layer 13 and using the difference in the refractive indices between the organic layer 13 and the transparent layer 14. Moreover, the third reflective interface 17 is formed by using the difference in the refractive indices between the transparent layer 14 and the second electrode 12. The transparent layer 14 is formed, for example, from nibium oxide or the like. The transparent layer 14 may not be a layer made up of one layer but may be a stacked structure of two or more transparent layers having different refractive indices depending on a necessary flat wavelength range and the viewing angle characteristics.

The second electrode 12 from which light is extracted is formed from ITO that is generally used as a transparent electrode material, an oxide of indium and zinc, and the like and is used as a cathode electrode. The thickness of the second electrode 12 is in the range of 30 to 3000 nm, for example.

The second electrode 12 may also serve as the transparent layer 14, and in this case, the second reflective interface 16 is formed between the organic layer 13 and the second electrode 12.

The passivation film 21 is formed from a transparent dielectric material. The transparent dielectric may not necessarily have the same refractive index as the material of the second electrode 12. When the second electrode 12 also serves as the transparent layer 14 as described above, the interface between the second electrode 12 and the passivation film 21 may serve as the second or third reflective interface 16 or 17 by using the difference in the refractive indices thereof. As the transparent dielectric material, silicon dioxide ($SiO_2$), silicon nitride (SiN), and the like can be used, for example. The thickness of the passivation film 21 is in the range of 500 to 10000 nm, for example.

A semitransparent reflective layer may be formed between the organic layer 13 and the transparent layer 14, as necessary. The semitransparent reflective layer is formed of a metal layer, for example, of magnesium (Mg), silver (Ag), or an alloy thereof, and the thickness is set to 5 nm or less, and preferably in the range of 3 to 4 nm or less.

Example 2

Example 2 is an example corresponding to the first embodiment.

Figure 14:
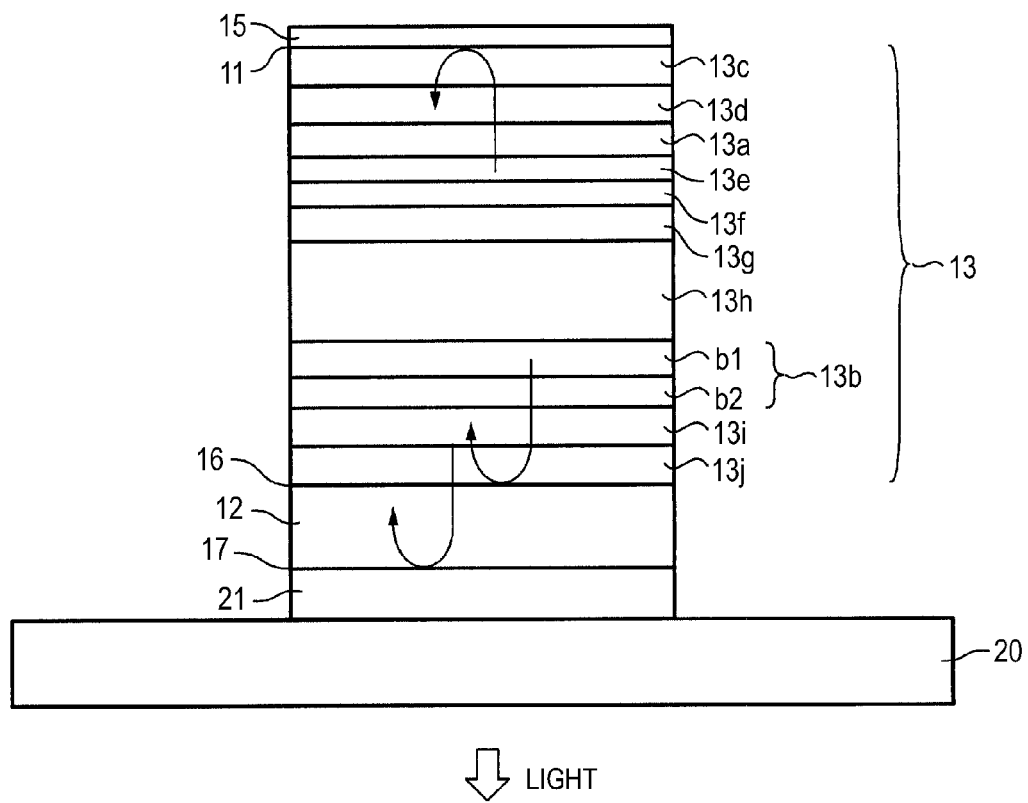
FIG. 14 is a sectional diagram showing a bottom emission-type organic EL device according to Example 2.

FIG. 14 shows an organic EL device according to Example 2. This organic EL device is a bottom emission-type organic EL device. As shown in FIG. 14, in this organic EL device, a passivation film 21, a second electrode 12, an organic layer 13, and a first electrode 11 are sequentially stacked on a transparent substrate 20 in that order from the lower side. In this case, light emitted from the side of the second electrode 12 passes through the substrate 20 to be extracted to the outside. The second electrode 12 also serves as the transparent layer 14 of Example 1. Moreover, a second reflective interface 16 is formed between the organic layer 13 and the second electrode 12, and a third reflective interface 17 is formed between the second electrode 12 and the passivation film 21. Other configurations are the same as Example 1.

4. Fourth Embodiment

<Organic EL Illumination Apparatus>

Figure 15:
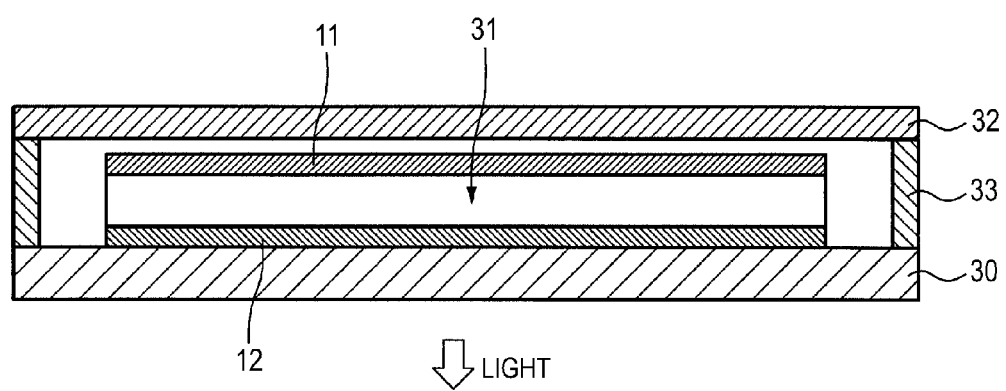
FIG. 15 is a sectional diagram showing an organic EL illumination apparatus according to a fourth embodiment of the present invention.

FIG. 15 shows an organic EL illumination apparatus according to a fourth embodiment.

As shown in FIG. 15, in this organic EL illumination apparatus, an organic EL device 31 according to any one of the first to third embodiments is mounted on a transparent substrate 30. In this case, the organic EL device 31 is mounted on the substrate 30 with the side of the second electrode 12 facing downward. Thus, light emitted from the side of the second electrode 12 passes through the substrate 30 to be extracted to the outside. A sealing substrate 32 is provided so as to face the substrate 30 with the organic EL device 31 interposed therebetween, and the outer peripheral portions of the sealing substrate 32 and the substrate 30 are sealed by a sealing material 33. The top-view shape of the organic EL illumination apparatus is chosen as necessary, and is square or rectangular, for example. Although only one organic EL device 31 is shown in FIG. 15, a plurality of organic EL devices 31 may be mounted on the substrate 30 in a desired layout, as necessary. The details of a configuration of the organic EL illumination apparatus other than the organic EL device 31 and the other configurations are the same as those of a known organic EL illumination apparatus.

According to the fourth embodiment, since the organic EL device 31 according to any one of the first to third embodiments is used, it is possible to realize an organic EL illumination apparatus which serves as a field light source having good intensity distribution properties and small viewing-angle dependency (that is, a variation in intensity or color in accordance with an illumination direction is very small). Moreover, by choosing the emission color of the organic EL device 31 by designing the first and second light-emitting layers 13a and 13b, it is possible to obtain various emission colors other than white emission color. Thus, it is possible to realize an organic EL illumination apparatus having excellent color rendering properties.

5. Fifth Embodiment

<Organic EL Display Apparatus>

Figure 16:
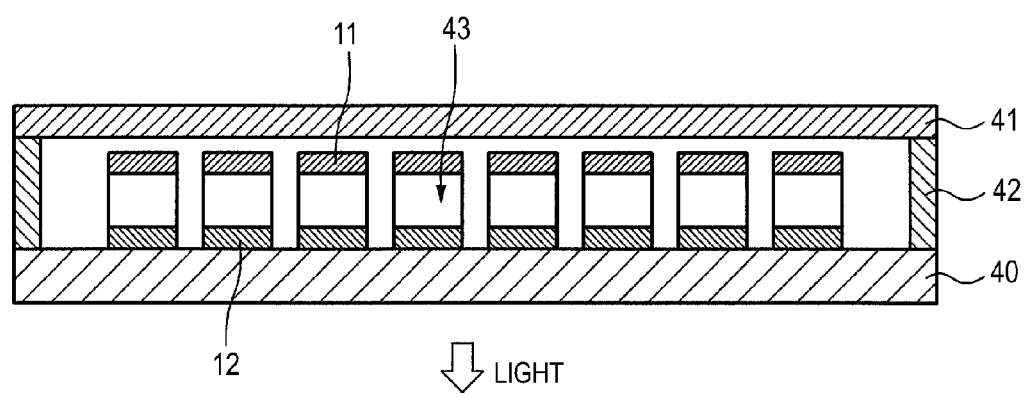
FIG. 16 is a sectional diagram showing an organic EL display apparatus according to a fifth embodiment of the present invention.

FIG. 16 shows an organic EL display apparatus according to a fifth embodiment. This organic EL display apparatus is an active matrix-type display apparatus.

As shown in FIG. 16, in this organic EL display apparatus, a driving substrate 40 and a sealing substrate 41 are provided so as to face each other, and the outer peripheral portions of the driving substrate 40 and the sealing substrate 41 are sealed by a sealing material 42. In the driving substrate 40, pixels formed of the organic EL device 43 according to any one of the first to third embodiments are formed on a transparent glass substrate, for example, in a 2-dimensional array form. On the driving substrate 40, a thin-film transistor used as a pixel driving active device is formed for each pixel. In addition, on the driving substrate 40, scanning lines, current supply lines, and data lines for driving the thin-film transistors of the respective pixels are formed in the vertical and horizontal directions. A display signal corresponding to every display pixel is supplied to the thin-film transistors of the respective pixels, and the pixels are driven in accordance with the display signals, and images are displayed. The details of a configuration of the organic EL display apparatus other than the organic EL device 43 and the other configurations are the same as those of a known organic EL display apparatus.

This organic EL display apparatus can be used as a color display apparatus as well as a black-and-white display apparatus. When this organic EL display apparatus is used as a color display apparatus, an RGB color filter is provided on the side of the driving substrate 40, specifically between the second electrode 12 of the organic EL device 43 and the driving substrate 40, for example.

According to the fifth embodiment, since the organic EL device 31 according to any one of first to third embodiments is used, it is possible to realize an organic EL display apparatus which has a high display quality and in which a variation in luminance and hue in accordance with a viewing angle is very small.

While specific embodiments and examples of the present invention have been described in detail, the present invention is not limited to those embodiments and examples described above, but various changes and modifications may be effected therein based on the technical spirit of the invention.

For example, numerical values, structures, configurations, shapes, materials, and the like shown in the foregoing embodiments and examples are no more than mere examples, and other appropriate numerical values, structures, configurations, shapes, materials, and the like, can be optionally used.

The present application contains subject matter related to that disclosed in Japanese Priority Patent Application JP 2010-018490 filed in the Japan Patent Office on Jan. 29, 2010, the entire contents of which is hereby incorporated by reference.

What is claimed is:

1. A light-emitting device comprising:
an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;
a first reflective interface which is provided on the side of the first electrode so as to reflect light emitted from the first light-emitting layer and the second light-emitting layer to be emitted from the side of the second electrode; and
a second reflective interface and a third reflective interface which are sequentially provided on the side of the second electrode at mutually separated positions in that order in a direction from the first electrode to the second electrode,
wherein an optical distance between the first reflective interface and a luminescent center of the first light-emitting layer is set so that light having a central wavelength of an emission spectrum of the first light-emitting layer is reinforced through interference between the first reflective interface and the luminescent center of the first light-emitting layer,
wherein an optical distance between the first reflective interface and a luminescent center of the second light-emitting layer is set so that light having a central wavelength of an emission spectrum of the second light-emitting layer is reinforced through interference between the first reflective interface and the luminescent center of the second light-emitting layer, and
wherein the reflection of light by the second reflective interface and the reflection of light by the third reflective interface occur so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened.

2. The light-emitting device according to claim 1, wherein when the optical distance between the first reflective interface and the luminescent center of the first light-emitting layer is L11, the optical distance between the first reflective interface and the luminescent center of the second light-emitting layer is L21, an optical distance between the luminescent center of the first light-emitting layer and the second reflective interface is L12, an optical distance between the luminescent center of the second light-emitting layer and the second reflective interface is L22, an optical distance between the luminescent center of the first light-emitting layer and the third reflective interface is L13, an optical distance between the luminescent center of the second light-emitting layer and the third reflective interface is L23, the central wavelength of an emission spectrum of the first light-emitting layer is λ1, and the central wavelength of an emission spectrum of the second light-emitting layer is λ2, L11, L21, L12, L22, L13, and L23 are chosen so as to satisfy all the expressions (1) to (8) and at least one of the expressions (9) and (10).

$$2L11/\lambda 11+\phi 1/2\pi =m \quad (1)$$

$$2L21/\lambda 21+\phi 1/2\pi =n \text{(where } n\geq m+1\text{)} \quad (2)$$

$$2L12/\lambda 12+\phi 2/2\pi =m'+1/2 \quad (3)$$

$$2L22/\lambda 22+\phi 2/2\pi =n'+1/2 \quad (4)$$

$$2L13/\lambda 13+\phi 3/2\pi =m''+1/2 \quad (5)$$

$$2L23/\lambda 23+\phi 3/2\pi =n''+1/2 \quad (6)$$

$$\lambda 1-30<\lambda 11<\lambda 1+80 \quad (7)$$

$$\lambda 2-30<\lambda 21<\lambda 2+80 \quad (8)$$

$\lambda 12\leq \lambda 1-15$ and $\lambda 13\geq \lambda 1+15$, or $$\lambda 13\leq \lambda 1-15 \text{ and } \lambda 12\geq \lambda 1+15 \quad (9)$$

$\lambda 22\leq \lambda 2-15$ and $\lambda 23\geq \lambda 2+15$, or $$\lambda 23\leq 2-15 \text{ and } \lambda 22\geq \lambda 2+15 \quad (10)$$

where m, m', m'', n, n', n'' are integers,
$\lambda 1, \lambda 2, \lambda 11, \lambda 21, \lambda 12, \lambda 22, \lambda 13$, and $\lambda 23$ are in units of nm,
$\phi 1$ is a phase shift occurring when light of each wavelength is reflected by the first reflective interface,
$\phi 2$ is a phase shift occurring when light of each wavelength is reflected by the second reflective interface, and
$\phi 3$ is a phase shift occurring when light of each wavelength is reflected by the third reflective interface.

3. The light-emitting device according to claim 2, wherein peaks of a spectral transmittance curve of an interference filter of the light-emitting device are substantially flat, or the slopes thereof are substantially the same in the wavelength range of all emission colors.

4. The light-emitting device according to claim 3, wherein a decrease of luminance at a viewing angle of 45° is 30% or less with respect to luminance at a viewing angle of 0°, and a chromaticity shift of $\Delta uv\leq 0.015$ is obtained.

5. The light-emitting device according to claim 4, wherein a difference between the wavelengths of the light of two or more different colors is within 120 nm.

6. The light-emitting device according to claim 5, wherein m=0 and n=1.

7. The light-emitting device according to claim 1, wherein the first electrode, the organic layer, and the second electrode are sequentially stacked on a substrate.

8. The light-emitting device according to claim 7, wherein a transparent electrode layer having a thickness of 1 μm or more, a transparent insulating layer, a resin layer, a glass layer, or an air layer is formed on an outer side of the third reflective interface.

9. The light-emitting device according to claim 1, wherein the second electrode, the organic layer, and the first electrode are sequentially stacked on a substrate.

10. The light-emitting device according to claim 9, wherein a transparent electrode layer having a thickness of 1 μm or more, a transparent insulating layer, a resin layer, a glass layer, or an air layer is formed on an outer side of the third reflective interface.

11. The light-emitting device according to claim 1, wherein a metal layer having a thickness of 5 nm or less is formed between the second light-emitting layer and the second electrode.

12. The light-emitting device according to claim 1, wherein at least one of the first reflective interface, the second reflective interface, and the third reflective interface is divided into a plurality of reflective interfaces.

13. The light-emitting device according to claim 1, wherein when the luminescent centers of light-emitting layers of the first or second light-emitting layer emitting light of two or more different colors may not be regarded as identical, the light-emitting device further includes a reflective layer which is provided so as to maintain the flatness of the peaks of a spectral transmittance curve of an interference filter of the light-emitting device.

14. An illumination apparatus comprising:
at least one light-emitting device,
wherein the light-emitting device includes
an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;
a first reflective interface which is provided on the side of the first electrode so as to reflect light emitted from the first light-emitting layer and the second light-emitting layer to be emitted from the side of the second electrode; and
a second reflective interface and a third reflective interface which are sequentially provided on the side of the second electrode at mutually separated positions in that order in a direction from the first electrode to the second electrode,
wherein an optical distance between the first reflective interface and a luminescent center of the first light-emitting layer is set so that light having a central wavelength of an emission spectrum of the first light-emitting layer is reinforced through interference between the first reflective interface and the luminescent center of the first light-emitting layer,
wherein an optical distance between the first reflective interface and a luminescent center of the second light-emitting layer is set so that light having a central wavelength of an emission spectrum of the second light-emitting layer is reinforced through interference between the first reflective interface and the luminescent center of the second light-emitting layer, and
wherein the reflection of light by the second reflective interface and the reflection of light by the third reflective interface occur so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened.

15. A display apparatus comprising:
at least one light-emitting device,
wherein the light-emitting device includes
an organic layer which is interposed between a first electrode and a second electrode and in which a first light-emitting layer and a second light-emitting layer emitting light of single colors or two or more different colors in a visible wavelength region are sequentially included at mutually separated positions in that order in a direction from the first electrode to the second electrode;
a first reflective interface which is provided on the side of the first electrode so as to reflect light emitted from the first light-emitting layer and the second light-emitting layer to be emitted from the side of the second electrode; and
a second reflective interface and a third reflective interface which are sequentially provided on the side of the second electrode at mutually separated positions in that order in a direction from the first electrode to the second electrode,
wherein an optical distance between the first reflective interface and a luminescent center of the first light-emitting layer is set so that light having a central wavelength of an emission spectrum of the first light-emitting layer is reinforced through interference between the first reflective interface and the luminescent center of the first light-emitting layer,
wherein an optical distance between the first reflective interface and a luminescent center of the second light-emitting layer is set so that light having a central wavelength of an emission spectrum of the second light-emitting layer is reinforced through interference between the first reflective interface and the luminescent center of the second light-emitting layer, and
wherein the reflection of light by the second reflective interface and the reflection of light by the third reflective interface occur so that light having wavelengths shifted by an amount of +15 nm or more and −15 nm or less from at least one of the central wavelength of the emission spectrum of the first light-emitting layer and the central wavelength of the emission spectrum of the second light-emitting layer is weakened.

16. The display apparatus according to claim 15, further comprising:
a driving substrate on which an active device is provided so as to supply a display signal corresponding to every display pixel to the light-emitting device; and
a sealing substrate provided so as to face the driving substrate,
wherein the light-emitting device is disposed between the driving substrate and the sealing substrate.

17. The display apparatus according to claim 16, wherein a color filter which transmits light emitted from the side of the second electrode is provided on a substrate that is disposed on the side of the second electrode of the light-emitting device among the driving substrate and the sealing substrate.

\* \* \* \* \*